(12) United States Patent
Suzuki et al.

(10) Patent No.: US 11,138,931 B2
(45) Date of Patent: Oct. 5, 2021

(54) DISPLAY DEVICE AND MANUFACTURING METHOD THEREFOR

(71) Applicant: SHARP KABUSHIKI KAISHA, Sakai (JP)

(72) Inventors: Nobuhiko Suzuki, Sakai (JP); Yasushi Kubota, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/042,878

(22) PCT Filed: Mar. 30, 2018

(86) PCT No.: PCT/JP2018/013844
§ 371 (c)(1),
(2) Date: Sep. 28, 2020

(87) PCT Pub. No.: WO2019/187088
PCT Pub. Date: Oct. 3, 2019

(65) Prior Publication Data
US 2021/0020100 A1 Jan. 21, 2021

(51) Int. Cl.
*G09G 3/3225* (2016.01)
*G09G 3/20* (2006.01)

(52) U.S. Cl.
CPC ......... *G09G 3/3225* (2013.01); *G09G 3/2003* (2013.01); *G09G 2300/0809* (2013.01); *G09G 2320/0666* (2013.01)

(58) Field of Classification Search
None
See application file for complete search history.

(56) References Cited

U.S. PATENT DOCUMENTS

2006/0139254 A1* 6/2006 Hayakawa ........... G09G 3/3291
345/76
2015/0379927 A1* 12/2015 Cai ........................ G09G 3/006
345/214

FOREIGN PATENT DOCUMENTS

JP H09-61458 A 3/1997

* cited by examiner

*Primary Examiner* — Christopher J Kohlman
(74) *Attorney, Agent, or Firm* — ScienBiziP, P.C.

(57) ABSTRACT

A display device includes: a display region in which first light-emitting elements by together with pixel circuits constitute pixels and are arranged in a matrix shape; and control circuits having electrical control function to the display region, wherein a determination circuit connected to a control line or to a node provided in the control circuit, and a second light-emitting element and a third light-emitting element connected to the determination circuit and configured to emit different colors from each other are provided in the frame region, and the determination circuit alternately cause only one of the second light-emitting element and the third light-emitting element to emit light.

14 Claims, 7 Drawing Sheets

DISPLAY DEVICE AND MANUFACTURING METHOD THEREFOR

TECHNICAL FIELD

The disclosure is related to a display device and a manufacturing method therefor.

BACKGROUND ART

A display device in which light-emitting elements such as organic EL elements constitutes pixels includes control circuits configured to perform electrical control on the pixels to display an image. An example of the control circuits includes, for example, a scanning line drive circuit, and these control circuits require precise action. Therefore, there is a need to inspect whether a fault has not occurred in the control circuits. As a known-inspection means, an electrical signal is measured by bringing an inspection probe into direct contact with the internal node of interest from above the sealing resin (PTL 1).

CITATION LIST

Patent Literature

PTL 1: JP 09-061458 A

SUMMARY

Technical Problem

However, because thinner display devices have been developed in recent years, and display devices built on flexible substrates have also been developed, the display devices have become poor in flattening during inspection, so it has become difficult to accurately contact the inspection probe with the node of interest.

Solution to Problem

Thus, as a means for solving the above-described problem, a display device according to the disclosure is a display device including a display region and a frame region provided around the display region, and configured to display an image by causing a first light-emitting element provided in the display region to emit light, the display device including: a plurality of data lines to which data signals are supplied to display the image; a plurality of control lines arranged to intersect the plurality of data lines; a plurality of pixel circuits provided with the first light-emitting element provided at each intersection point of the plurality of data lines and the plurality of control lines; a control circuit configured to activate a corresponding control line at a timing at which a data signal of the data signals is supplied to a data line of the plurality of data lines; a second light-emitting element and a third light-emitting element provided in the frame region for each of the plurality of control lines, the second light-emitting element and the third light-emitting element being configured to emit different colors from each other; and a determination circuit provided in the frame region for each of the plurality of control lines, the determination circuit being connected to a control line of the plurality of control lines or a node provided in the control circuit, wherein the second light-emitting element and the third light-emitting element are connected to the control line or the node via the determination circuit, and the determination circuit causes the second light-emitting element to emit light but does not cause the third light-emitting element to emit light in a case where an electrical signal from the control line or the node is one of on and off, and does not cause the second light-emitting element to emit light but causes the third light-emitting element to emit light in a case where an electrical signal from the control line or the node is other of on and off. Note that the operation of the determination circuit can include a case in which the electrical signal is on in a case where the electrical signal is at the high level and is off in a case where the electrical signal is at the low level.

Note that the object can be achieved in either way where each light emission from the second light-emitting element and the third light-emitting element is detected as a graph indicating the light spectrum by using a device, or is detected as a color mixture through human visual sense.

It is also preferable that the determination circuit includes: a first transistor including a first control terminal to which the control line or the node is connected; and a second transistor including a second control terminal connected to the control line or the node connected to the first control terminal, in the first transistor, a first conduction terminal is connected to one of an anode electrode or a cathode electrode of the second light-emitting element, and a second conduction terminal is connected to one of an anode electrode or a cathode electrode of the third light-emitting element and a first constant voltage source, and in the second transistor, a first conduction terminal is connected to other of the anode electrode or the cathode electrode of the second light-emitting element and a second constant voltage source, and a second conduction terminal is connected to other of the anode electrode or the cathode electrode of the third light-emitting element.

Furthermore, it is also preferable that the determination circuit further includes: a third transistor connected between the second conduction terminal of the first transistor and the one of the anode electrode or the cathode electrode of the third light-emitting element and the first constant voltage source, and a control signal line for controlling on/off of the third transistor is connected to a control terminal of the third transistor.

Furthermore, it is also preferable that in two of the determination circuit adjacent, a luminescent color of a light-emitting element of at least one of the second light-emitting element and the third light-emitting element connected to one of the two of the determination circuit and a luminescent color of a light-emitting element of at least other of the second light-emitting element and the third light-emitting element connected to other of the two of the determination circuit differ from each other.

It is also preferable that the second light-emitting element and the third light-emitting element are provided between the display region and the control circuit, a light-emitting layer of the first light-emitting element and each light-emitting layer of the second light-emitting element and the third light-emitting element are in equal shape and equal size, and an opening of an edge cover of the light-emitting layer of the first light-emitting element is larger than an opening of an edge cover of each light-emitting layer of the second light-emitting element and the third light-emitting element.

Note that the "equal shape and equal size" means that in a case where the luminescent material of the light-emitting layer is deposited in the display region and the frame region by using masks having mask patterns of equal shape and equal size, the light-emitting layers of equal shape and equal size will be formed as a result in the display region and the frame region. Accordingly, the light-emitting layer of the light-emitting element and each light-emitting layer of the second light-emitting element and the third light-emitting element do not necessarily have to have exactly equal shape and equal size.

It is also preferable that a plurality of kinds of light-emitting elements emitting different colors from each other are used for a plurality of the second light-emitting element each provided in the plurality of control lines, and a plurality of kinds of light-emitting elements emitting different colors from each other are used for a plurality of the third light-emitting element each provided in the plurality of control lines.

It is also preferable that a plurality of the nodes are provided, a plurality of kinds of light-emitting elements emitting different colors from each other are used for a plurality of the second light-emitting element each provided in the plurality of the node, and a plurality of kinds of light-emitting elements emitting different colors from each other are used for a plurality of the third light-emitting element each provided in the plurality of the nodes.

It is also preferable that the control line is a scanning line and an emission line, the control circuit is a scanning line drive circuit and an emission driver, a plurality of kinds of light-emitting elements emitting different colors from each other are used for a plurality of the second light-emitting element each provided in the scanning line and the emission line, and a plurality of kinds of light-emitting elements emitting different colors from each other are used for a plurality of the third light-emitting element each provided in the scanning line and the emission line.

Furthermore, it is also preferable that the control line is a scanning line, and the control circuit is a scanning line drive circuit. It is also preferable that the control line is an emission line, and the control circuit is an emission driver.

Furthermore, it is also preferable that the first light-emitting element, the second light-emitting element, and the third light-emitting element are organic EL elements.

As a means for solving the above-described problems, a method for manufacturing a display device according to the disclosure is a method for manufacturing a display device including: a display region; a frame region provided around the display region; a first light-emitting element provided in the display region for displaying an image; a plurality of data lines to which data signals are supplied to display the image; a plurality of control lines arranged to intersect the plurality of data lines; a plurality of pixel circuits provided with the first light-emitting element provided at each intersection point of the plurality of data lines and the plurality of control lines; a control circuit configured to activate a corresponding control line at a timing at which a data signal of the data signals is supplied to a data line of the plurality of data lines; a second light-emitting element and a third light-emitting element provided in the frame region for each of the plurality of control lines, the second light-emitting element and the third light-emitting element being configured to emit different colors from each other; and a determination circuit provided in the frame region for each of the plurality of control lines, the determination circuit being connected to a control line of the plurality of control lines or a node provided in the control circuit, wherein the control circuit is inspected by inputting, to the second light-emitting element and the third light-emitting element, an electrical signal flowing through the control line or an electrical signal flowing through a node provided in the control circuit via the determination circuit, and detecting and evaluating light emission from the second light-emitting element and the third light-emitting element.

Furthermore, it is also preferable that in inspecting the control circuit, a color mixture of a luminescent color of the second light-emitting element and a luminescent color of the third light-emitting element is used to detect a defect of a corresponding control line.

Furthermore, it is also preferable that the first light-emitting element, the second light-emitting element, and the third light-emitting element are formed simultaneously.

Advantageous Effects of Disclosure

According to the disclosure, it is not necessary to directly bring the probe into contact with the node to be inspected in the control circuit, and it is possible to realize an inspection device that enables inspection of the node in a non-contact manner. As a result, the occurrence of damage to the metal wiring line constituting the node and the sealing resin covering the surface of the metal wiring line can be eliminated, and the occurrence of secondary defects associated with the inspection process by the contact probe can be prevented.

In a case where the node of interest has a defect, the light emission spectrum or the luminescent color of the light emission from the inspection light-emitting element is different from that of the light emission from the other normal inspection light-emitting elements, so it is easy to sense the defect by visual recognition, and it is easy and quick to perform inspection. This is because there is no need for a special sensing device as long as defect detection is possible by visual recognition.

Furthermore, because a defect can be detected in terms of the difference in the color mixture of the luminescent colors recognized in the measurement period from the inspection light-emitting element, the type of defect can be determined by the visual recognition of the luminescent color without a special sensing device being used.

BRIEF DESCRIPTION OF DRAWINGS

FIG. 10(a) illustrates a cross-sectional example of a periphery of the first light-emitting element 6, and (b) illustrates a cross-sectional example of a periphery of the second light-emitting element 9.

DESCRIPTION OF EMBODIMENTS

Embodiments according to the disclosure will be described below in detail with reference to the drawings. Note that in the present specification and the drawings, constituent elements having substantially the same functional configurations will be given the same reference numerals, and redundant descriptions thereof will be omitted.

Figure 1:
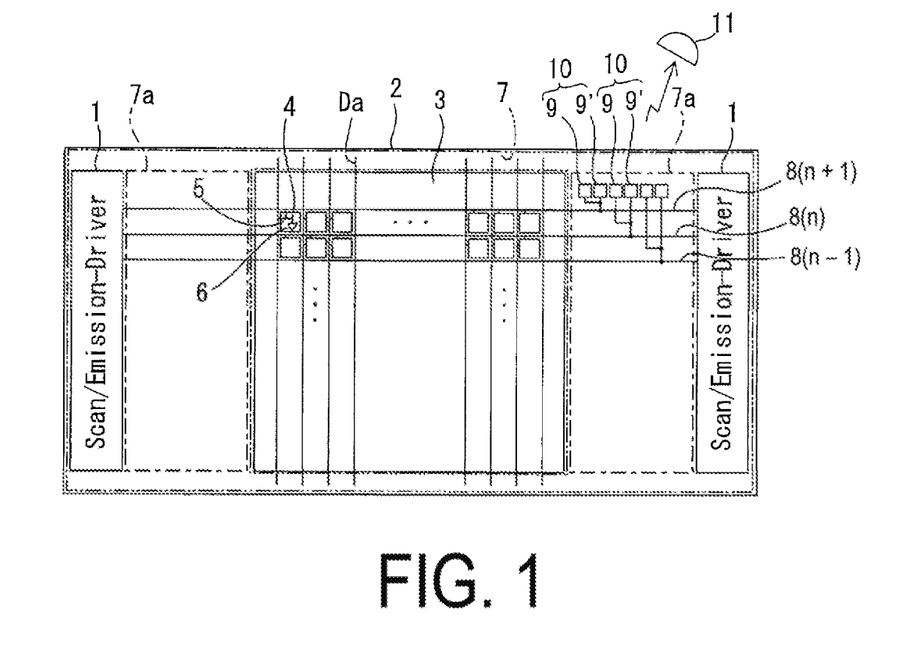
FIG. 1 is a schematic view of a display device 2 including a display region 3 in which first light-emitting elements 6 by together with pixel circuits 5 constitute pixels 4 and are arranged in a matrix shape, and control circuits 1 having electrical control function to the display region 3.

FIG. 1 illustrates a schematic view of a display device 2 including a display region 3 in which each pixel 4 is constituted by each pixel circuit 5 with each first light-emitting element 6 at each intersection point between a plurality of data lines Da disposed along the vertical direction and a plurality of control lines 8 disposed so as to intersect with the data lines Da.

Control circuits 1 connected to the control lines 8 are provided on both left and right sides of the display device 2, with frame regions 7 provided around the display region 3 interposed therebetween. The display region 3 is a region in which image content is displayed. The frame regions 7 provided outside the periphery of the display region 3 are not regions where the image content is displayed, but are regions that can be covered by the frame body at a time in which the display device 2 is manufactured.

The control circuits 1 are provided with a control function that activates the corresponding control lines 8 at the timing at which the data signal is supplied to the data lines Da. A plurality of the control lines 8 are disposed from the control circuits 1 toward the display region 3. In the present embodiment, as illustrated in FIG. 1, from below the display device 2, the control lines may be indicated as control lines 8(n−1), 8(n), and 8(n+1) for distinction, but may be collectively referred to as the control lines 8. Note that n represents an integer.

Figure 2:
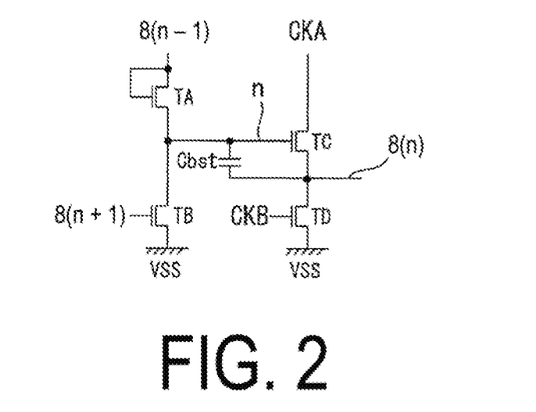
FIG. 2 illustrates an example of a circuit configuration in a case where the control circuits are scanning line drive circuits.

The control circuits 1 may in particular be either scanning line drive circuits or emission drivers. The control lines 8 function as scanning lines in the case where the control circuits 1 are scanning line drive circuits, and function as emission lines in the case of emission drivers. FIG. 2 illustrates an example of a circuit configuration in a case where the control circuits 1 are scanning line drive circuits.

The scanning line drive circuit illustrated in FIG. 2 holds the signal to the node n connected to the control terminal of the transistor TC and one end of the capacitance Cbst via the transistor TA turned on by the signal from the control line 8(n−1). The transistor TC is turned on by the signal held in the node n, and the control line 8(n) is activated by receiving the input of the clock signal CKA in the first conduction terminal of the transistor TC. Note that the transistor TD holds the potential of the control line 8(n). Thereafter, the transistor TD is turned on by the clock signal CKB in an inverted relationship with the clock signal CKA, and discharges the charge of the control line 8(n) to the low potential power source VSS. After a predetermined period of time in which the control line 8(n) is activated, the transistor TB is turned on by a signal from the control line 8(n+1), and discharges the charge corresponding to the signal held at the node n to the low potential power source VSS.

The control lines 8 are introduced into the display region 3 via the frame regions 7. In the frame regions 7, second light-emitting elements 9 and third light-emitting elements 9' are provided, which are connected so as to be able to emit light separately corresponding to respective electrical signals in a case where different electrical signals are input from the control lines 8 or nodes provided in the control circuits 1.

Figure 3:
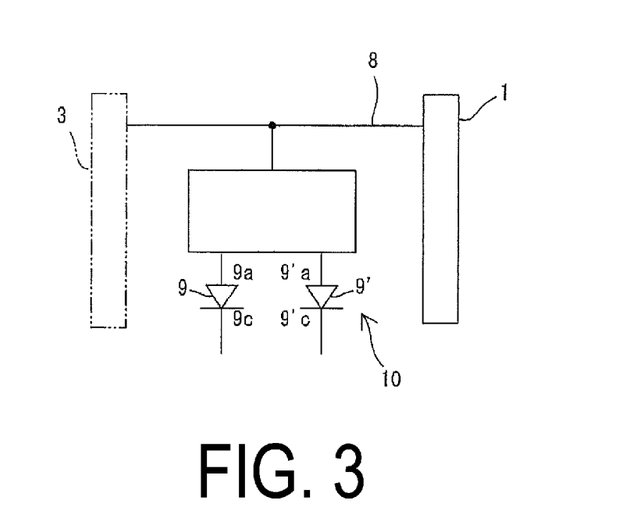
FIG. 3 schematically illustrates a determination circuit 10 connected to a control line 8.

As illustrated in FIG. 3, a determination circuit 10 can determine a difference in the electrical signals from the control line 8 to allow the light emission of either the second light-emitting element 9 or the third light-emitting element 9' corresponding to each of different electrical signals.

Specifically, the determination circuit 10 causes the second light-emitting element 9 to emit light and does not cause the third light-emitting element 9' to emit light in a case where an electrical signal from the control line 8 or a node provided in the control circuit 1 is one of a high voltage (high level) and a low voltage (low level). In a case where the electrical signal from the control line 8 or the node provided in the control circuit 1 is the other of the high voltage (high level) and low voltage (low level), the determination circuit 10 does not cause the second light-emitting element 9 to emit light and causes the third light-emitting element 9' to emit light.

Although FIG. 3 illustrates an example in which an electrical signal flowing through the control line 8, which is an output signal of the scanning line drive circuit 1, is input to the second light-emitting element 9 and the third light-emitting element 9' via the determination circuit 10, the embodiment is not limited thereto, and an electrical signal flowing in any node may be input. For example, the conduction terminal or the control terminal of the transistor TB of FIG. 2, the conduction terminal or the control terminal of the transistor TD, or the like may be connected. A plurality of the second light-emitting element and a plurality of the third light-emitting element may be provided, and formed so that electrical signals of a plurality of nodes can be input. At this time, in a case where the color emitted is changed for each node, it can be easily inspected because it can be seen which nodes are faulty by observing the color. In a case where an output signal of a scanning line drive circuit and an output signal of an emission drivers are input to the second light-emitting element and the third light-emitting element each emitting different colors, it can be easily inspected because it can be seen whether the circuit is faulty by observing the color.

Here, in the description of the following embodiments, the second light-emitting element 9 and the third light-emitting element 9' are formed in the same steps as the first light-emitting elements 6 constituting the pixels 4 of the display region 3.

In the present embodiment, the first light-emitting elements 6, the second light-emitting elements 9, and the third light-emitting elements 9' are organic EL elements.

Note that the second light-emitting elements 9 and the third light-emitting elements 9' are also formed in light-emitting elements of different colors so that the first light-emitting elements 6 are created into different red, blue, and green light-emitting elements, which are three primary colors. As a result, in a case where different electrical signals are received from the control lines 8, the second light-emitting elements 9 and the third light-emitting elements 9' emit light separately in correspondence with the respective electrical signals, and the luminescent color from the second light-emitting elements 9 and the luminescent color from the third light-emitting elements 9' can be different.

The light emitted from the second light-emitting elements 9 and the third light-emitting elements 9' can be received by a light receiving unit 11 provided outside the display device 2. The light receiving unit 11 is capable of receiving light over an inspection period t1 and detecting the light spectrum or the luminescent color. By detecting the light emitted from the second light-emitting elements 9 and the third light-emitting elements 9' with the light receiving unit 11, it is possible to determine whether or not predetermined electrical signals have been output from the control circuits 1 to the control lines 8. Note that a photodiode may be used for the light receiving unit 11, and the light spectrum is preferably analyzed by a spectrophotometer connected to the light receiving unit 11.

Furthermore, according to the disclosure, eyes of a person to inspect can be used as the light receiving unit 11. By visually viewing the light emitted from the second light-emitting elements 9 and the third light-emitting elements 9' by using the eyes, it is possible to determine whether or not predetermined electrical signals have been output to the control lines 8. Specifically, the inspection period t1 is extremely short, so the light emitted from the second light-emitting elements 9 and the third light-emitting elements 9' is recognized as a color mixture due to the afterimage effect. Thus, in a case where an abnormality occurs in the operation of the second light-emitting elements 9 and the third light-emitting elements 9', a change in color that is different from a luminescent color that is expected during normal time can be sensed by the eyes to detect the abnormality, and the abnormality in the electrical signal output to the control lines 8 can be determined.

Next, a method for signal detection will be described.

For example, suppose the determination circuit 10 is configured to cause the second light-emitting element 9 to emit light and not cause the third light-emitting element 9' to emit light in a case where an electrical signal from the control line 8 or a node provided in the control circuit 1 is at the high level. In this case, in a case where the electrical signal from the control line 8 or the node provided in the control circuit 1 is at the low level, the determination circuit 10 is configured to not cause the second light-emitting element 9 to emit light but cause the third light-emitting element 9' to emit light. Note that in the present embodiment, the second light-emitting element 9 emits red light, and the third light-emitting element 9' emits green light.

Figure 5:
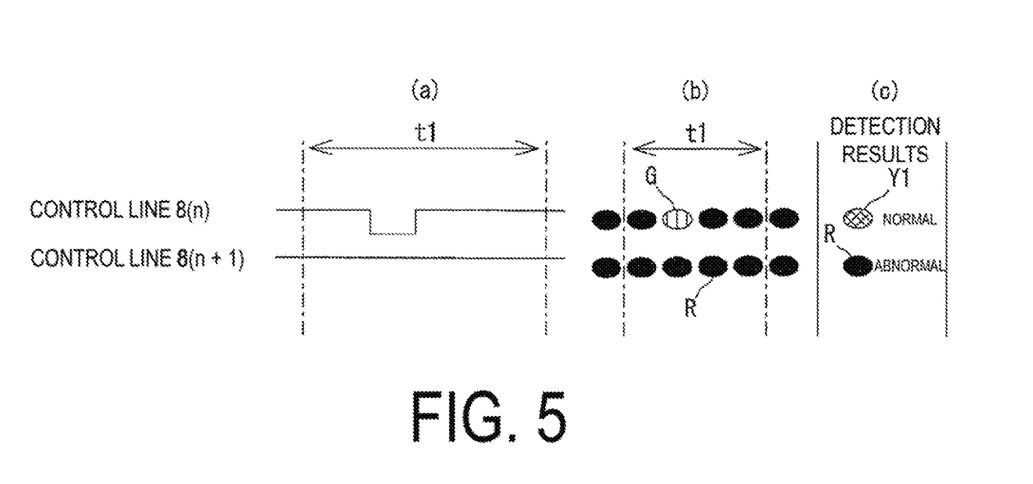
FIG. 5 is a diagram illustrating principles of a determination method performed by the determination circuit 10.

In this case, in a case where the potential of the control line 8 that is temporarily subjected transiently changes to the low level at a certain time in the detection period t1, the timing chart of the determination circuit 10 temporarily deforms the waveform as illustrated in the top row of FIG. 5(a). As seen in the top row of FIG. 5(b), a longitudinal hatched oval symbol G appears in the array of black oval symbols R corresponding to the time in which the potential changed to the low level. These oval signals R and G represent the red luminescent color and the green luminescent color, respectively. FIG. 5(c) illustrates how the color of the light emitted from the second light-emitting element 9 or the third light-emitting element 9' during the detection period illustrated in FIG. 5(b) is detected as a color mixture through human visual sense. As a result, as illustrated in the top row of FIG. 5(c), the yellow luminescent color represented by the oval symbol Y1, which is a color mixture of red light and green light as the detection result, can be confirmed. The hatched oval symbol Y1 composed of the intersecting striped pattern represent the yellow luminescent color.

On the other hand, in a case where the potential of the control line 8 to be detected does not change at the high level, the timing chart of the determination circuit 10 is constant as illustrated in the bottom row of FIG. 5(a). According to the bottom row of the conceptual diagram 5(b) in which the state of recognizing the light emission from the determination circuit 10 is represented along the time dividing the detection period for a fixed period of time, the oval symbols R representing the light emission image for each unit time are aligned. The black filled oval symbols R represent the red luminescent color. As a result, FIG. 5(b) illustrates that the red luminescent color is continuous in the bottom row. FIG. 5(c), which is illustrated further next to FIG. 5(b), illustrates the detection results from the determination circuit 10. According to the bottom row of FIG. 5(c), because the potential of the control line 8 has not changed during the detection period, the detection result is a red luminescent color.

Specific embodiments of the determination circuit 10 will be described below. Note that in the following embodiments, an electrical signal input from the control line 8 or a node provided in the control circuit 1 to the second light-emitting element 9 or the third light-emitting element 9' is included in the electrical signal from the control line 8.

First Embodiment

Structure

Figure 4:
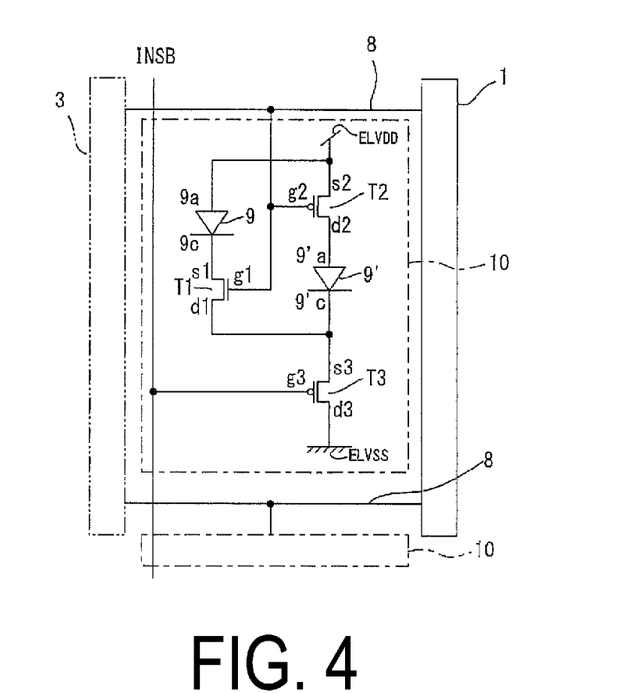
FIG. 4 illustrates a circuit configuration of the determination circuit 10 according to the first embodiment.

FIG. 4 illustrates a circuit configuration of the determination circuit 10 according to the first embodiment. According to the first embodiment, the first control terminal g1 of the first transistor T1 and the second control terminal g2 of the second transistor T2 are connected from the control line 8. Here, the first transistor T1 is an NMOS transistor and the second transistor T2 is a PMOS transistor.

The cathode 9c of the second light-emitting element 9 is connected to the first conduction terminal s1 of the first transistor T1, and the anode 9a of the second light-emitting element 9 is connected to the drive power supply ELVDD, which is the second constant voltage source. The drive power supply ELVDD is connected to the first conduction terminal s2 of the second transistor T2, and the second conduction terminal d2 is connected to the anode 9'a of the third light-emitting element 9'. Note that the drive power supply ELVDD may be replaced with an external power source other than the drive power supply ELVDD.

The cathode 9'c of the third light-emitting element 9' and the second conduction terminal d2 of the first transistor T1 are connected to the cathode power supply ELVSS, which is the first constant voltage source, via the third transistor T3 connected in series.

A control signal line INSB for controlling on/off of the third transistor is connected to the third control terminal g3 of the third transistor.

The first conduction terminal s3 of the third transistor T3 is connected to the second conduction terminal d2 of the first transistor T1 and the cathode 9'c of the third light-emitting element 9', while the second conduction terminal d3 is connected to the cathode power supply ELVSS.

Here, the determination circuit 10 of the first embodiment is a portion surrounded by the dot-dash line in FIG. 4.

In a case where an electrical signal is applied to the control line 8 during the inspection period t1 in which the control signal for turning on the third transistor T3 is input from the control signal line INSB to the control terminal g3, a signal for causing either the second light-emitting element 9 or the third light-emitting element 9' to emit light can be input.

In the inspection period t1, only one of the first transistor T1 or the second transistor T2 may be turned on by inverting the voltage applied to the control line 8 as an electrical signal. As a result, based on the difference in the electrical signal received from the control circuit 1 via the control line 8, either the second light-emitting element 9 or the third light-emitting element 9' to emit light can be selected by the current from the power source ELVDD.

In the first embodiment, in a case where a high voltage is applied to the control line 8, the first transistor T1 is turned on and the second light-emitting element 9 emits light. Here, the luminescent color of the second light-emitting element 9 is red. On the other hand, in a case where a low voltage is applied to the control line 8, the second transistor T2 is turned on, and the third light-emitting element 9' emits light. Here, the luminescent color of the third light-emitting element 9' is green.

Note that the second conduction terminal d1 of the first transistor T1 and the cathode 9'c of the third light-emitting element 9' may be directly connected to the cathode power supply ELVSS by omitting the third transistor T3. In this case, the inspection period t1 can be configured as desired, and an electrical signal may be input to the determination circuit 10 within the time configured to the inspection period t1.

Function

Next, a function of detecting an output abnormality from the control circuit 1 by using the determination circuit 10 will be described. As an example, the control circuit 1 illustrated in FIG. 1 is a scanning line circuit. A plurality of scanning lines extending in a horizontal direction from the control circuit 1 are referred to as control lines 8 of interest. Of these, a method for inspecting whether or not an abnormal electrical signal is input from control lines 8(n−1) to 8(n+2) will be described.

In Case where Control Lines 8(n−1) to 8(n+2) Function Normally

Figure 6:
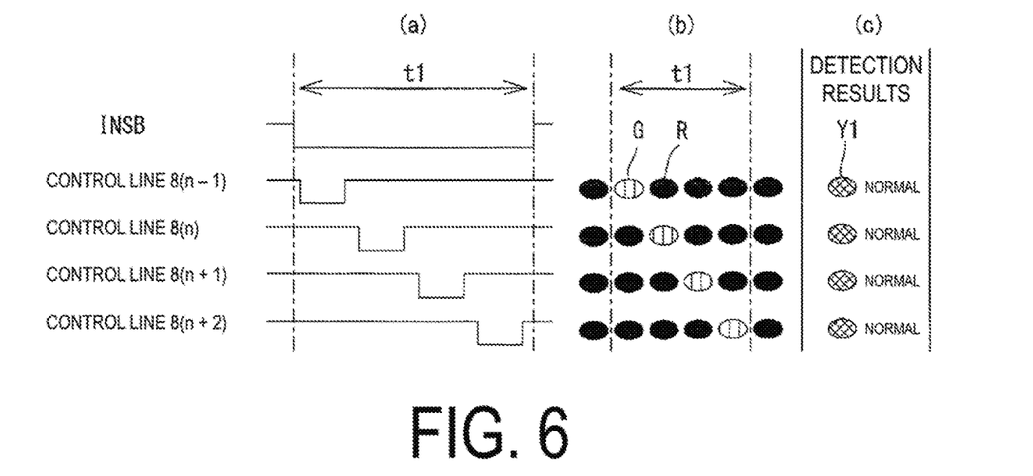
FIG. 6 illustrates a timing chart (a) of the determination circuit 10, a conceptual diagram (b) in which the state of recognizing the light emission from nodes of interest is represented along the time divided in four segments for a fixed period of time before and after an inspection period t1, and a table (c) showing the detection results from the determination circuit 10, in a case where control lines $8(n-1)$ to $8(n+2)$ are all operating normally.

FIG. 6 illustrates a timing chart (a) of the determination circuit 10 in a case where all of the control lines 8(n−1) to 8(n+2) are operating normally. Next to the timing chart (a) is illustrated the conceptual diagram (b) in which the state of recognizing the light emission of the determination circuit 10 is represented along the time divided for a fixed period of time before and after the inspection period t1. In FIG. 6(b), the black filled oval symbols R represent the red luminescent color, and the longitudinal hatched oval symbols G represent the green luminescent color. Note that the light receiving unit 11 is eyes of a person to inspect. Both FIGS. 6(a) and 6(b) progress in time from left to right.

FIG. 6(c), which is illustrated further next to FIG. 6(b), is a table showing the detection results from the determination circuit 10. FIG. 6(c) illustrates how the color of the light emitted from the second light-emitting element 9 or the third light-emitting element 9' during the inspection period t1 illustrated in FIG. 6(b) is detected as a color mixture through human visual sense. In the table of FIG. 6(c), the hatched oval symbols Y1 composed of the intersecting striped pattern represent the yellow luminescent color. Note that the luminescent colors indicated by the oval symbols R, G, and Y1 are the same in the following. In a case of viewing and observing the state of the inspection from the determination circuit 10, as illustrated in FIG. 6(c), the actual emission in the column shape is observed, so it is possible to easily determine the color mixture of the control lines with abnormalities compared to other normal color mixtures. The plurality of control lines can be simultaneously inspected by observing the light emission in the column shape from the plurality of determination circuits 10.

It is also possible to detect the color mixture as a light spectrum by using a device such as a spectrophotometer connected to the light receiving unit 11 using a photodiode.

According to the timing chart illustrated in FIG. 6(a), in the inspection period t1, electrical signals are provided such that the voltage changes from the high voltage +5.0 V to the low voltage −8.0 V in order from the control circuit 1 to the control lines 8(n−1) to 8(n+2). The cathode power supply ELVSS is fixed to −3.0 V.

In the case of FIG. 6 in which all of the control lines 8(n−1) to 8(n+2) are operating normally, the low voltage is sequentially applied for a fixed period of time every time over the control lines 8(n−1) to 8(n+2) (FIG. 6(a)).

As a result, the second transistor T2 of the determination circuit 10 connected to the control line 8(n−1) is turned on at the most left side of the time in four divisions in the inspection period t1 in FIG. 6(b), and the third light-emitting element 9' emits green so that the oval symbol G is indicated. On the other hand, because the high voltage is still applied to the control lines 8(n) to 8(n+2) at the same time at the most left side of the time in the inspection period t1, the first transistor T1 of the determination circuit 10 is turned on and the second light-emitting element 9 emits red so that the oval symbol R is indicated.

Next, the voltage of the control line 8(n) changes to the low voltage and the corresponding third light-emitting element 9' emits green at the second time from the left of the time in the four divisions in the inspection period t1 in FIG. 6(b) so that the oval symbol G is indicated. On the other hand, because the voltage of the control line 8(n−1), the control line 8(n+1), and the control line 8(n+2) are the high voltage, the corresponding second light-emitting element 9 emits red light, so that the oval symbol R is indicated. Each time the inspection period t1 progresses, the luminescent color from the determination circuit 10 changes similarly in the control line 8(n−1), the control line 8(n+1), and the control line 8(n+2).

As described above, in FIG. 6, the green light emission time ratios during the inspection period t1 are the same by changing the voltage to the low voltage for a fixed period of time in order from the control lines 8(n−1) to 8(n+2). Furthermore, because each time in which the inspection period t1 is divided into four is a short amount of time that is not discernable to the human eyes, the light is sensed as a color mixture of the luminescent colors from the second light-emitting element 9 and the third light-emitting element 9' during the inspection period t1 by the eyes of the person to view. As a result, as illustrated in the table in FIG. 6(c), the obtained detection results are oval symbols Y1 representing the yellow colors of the same color mixed in all of the control lines 8(n−1) to 8(n+2).

As described above, in a case where there is no change in the color mixture detected from the control lines 8(n−1) to 8(n+2), it can be determined that there is no abnormality in the electrical signal from the control circuit 1 to the control line 8 of interest.

Defect Detection Example of Control Line

Detection Example 1

Next, a case in which there is an abnormality in the control line 8 will be described along the same means as in FIG. 6.

Figure 7:
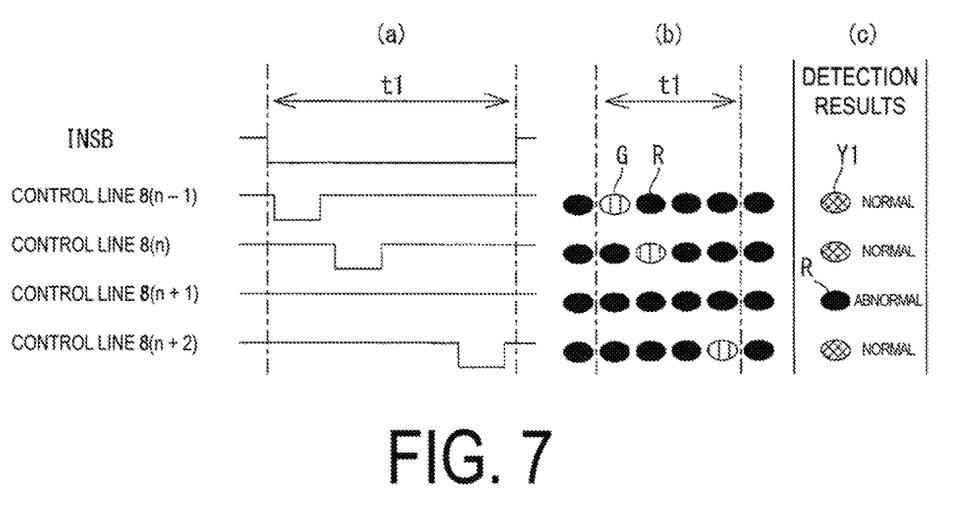
FIG. 7 illustrates a timing chart (a) of the determination circuit 10, a conceptual diagram (b) of the state of recognizing the light emission from nodes of interest, and a table (c) showing the detection results from the determination circuit 10, in a case where an abnormality has occurred in the control line 8(n+1).

As one example, as illustrated in FIG. 7, a case in which a predetermined voltage change does not occur for one control line 8(n+1) among the control lines 8(n−1) to 8(n+2) of interest will be described.

In this case as well, suppose the output of the electrical signal has been attempted from the control circuit 1 so that a voltage change similar to that in FIG. 6 occurs for the control line 8. As a result, voltage changes from high voltage to low voltage have occurred at the same timing as in FIG. 6 for the control lines 8(n−1), 8(n), and 8(n+2), but no electrical signal has been received from the control circuit 1 for the control line 8(n+1), and no voltage change has been generated (FIG. 7(a)).

In this case, the change in the luminescent color from the determination circuit 10 during the inspection period t1 occurs in the same manner as in FIG. 6 for the control lines 8(n−1), 8(n), and 8(n+2), but there is no change in luminescent color during the inspection period t1 for the control line 8(n+1) (FIG. 7(b)).

As a result, as illustrated in the table in FIG. 7(c) as a detection result, the oval symbol Y1 representing the yellow color, which is a normal color mixture, is indicated for the control lines 8(n−1), 8(n), and 8(n+2), but the oval symbol R indicating the red color remains for the control line 8(n+1), and it is possible to detect an abnormality that a predetermined electrical signal is not output to the control line 8(n+1).

Detection Example 2

Furthermore, another case in which there is an abnormality in the control line 8 will be described along the same means as in FIG. 6.

Figure 8:
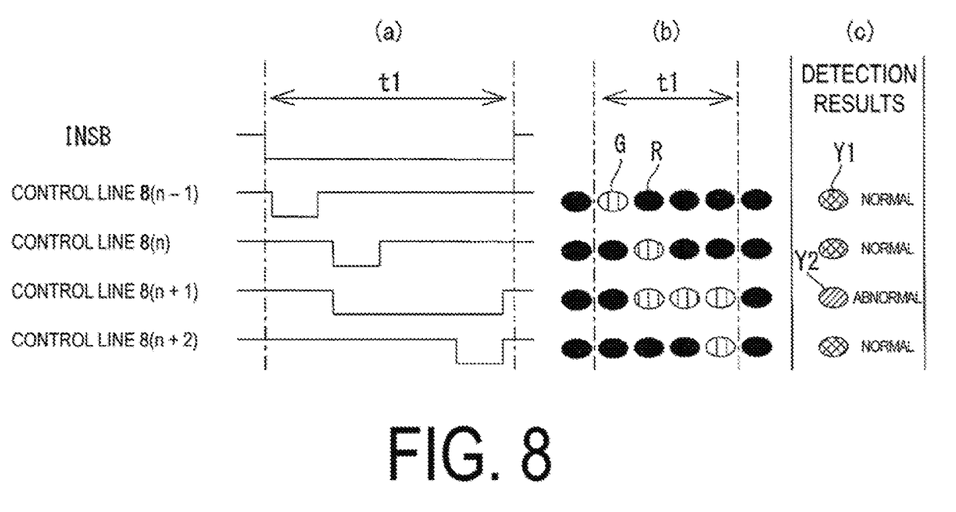
FIG. 8 illustrates a timing chart (a) of the determination circuit 10, a conceptual diagram (b) of the state of recognizing the light emission from nodes of interest, and a table (c) showing the detection results from the determination circuit 10, in a case where another abnormality has occurred in the control line 8(n+1).

As another example, as illustrated in FIG. 8, a case in which an unexpected voltage change occurs for one control line 8(n+1) among the control lines 8(n−1) to 8(n+2) of interest will be described.

In this case as well, suppose the output of the electrical signal has been attempted from the control circuit 1 so that a voltage change similar to that in FIG. 6 occurs for the control line 8. As a result, voltage changes from high voltage to low voltage occurred at the same timing as in FIG. 6 for the control lines 8(n−1), 8(n), and 8(n+2), but the low voltage state has continued continuously since the change in voltage of the control line 8(n) has started until the change in voltage of the control line 8(n+2) has ended for the control line 8(n+1) (FIG. 8(a)).

In this case, the change in the luminescent color from the determination circuit 10 during the inspection period t1 occurs in the same manner as in FIG. 6 for the control lines 8(n−1), 8(n), and 8(n+2), but for the control line 8(n+1), the luminescent color changes to green for a longer period of time than the control lines 8(n−1), 8(n), and 8(n+2) (FIG. 8(b)).

As a result, as illustrated in the table in FIG. 8(c) as a detection result, the oval symbol Y1 representing the yellow color, which is a normal color mixture, is indicated for the control lines 8(n−1), 8(n), and 8(n+2), but for the control line 8(n+1), it can be indicated as an oblique hatched oval symbol Y2 indicating a color that is more greenish than the normal yellow color. As a result, it is possible to detect the possibility that the control line 8(n+1) may be abnormal, e.g., shorted to the control lines 8(n) and 8(n+2).

In the manufacturing process of the display device 2, in a case where the second light-emitting element 9 and the third light-emitting element 9' are formed in the same step as the first light-emitting element 6, the change in the light spectrum or the luminescent color from the second light-emitting element 9 and the third light-emitting element 9' can be detected and evaluated, prior to the step of individually dividing the plurality of display devices 2 formed in a state connected to each other on the same substrate until the middle of the manufacturing process.

Second Embodiment

Figure 9:
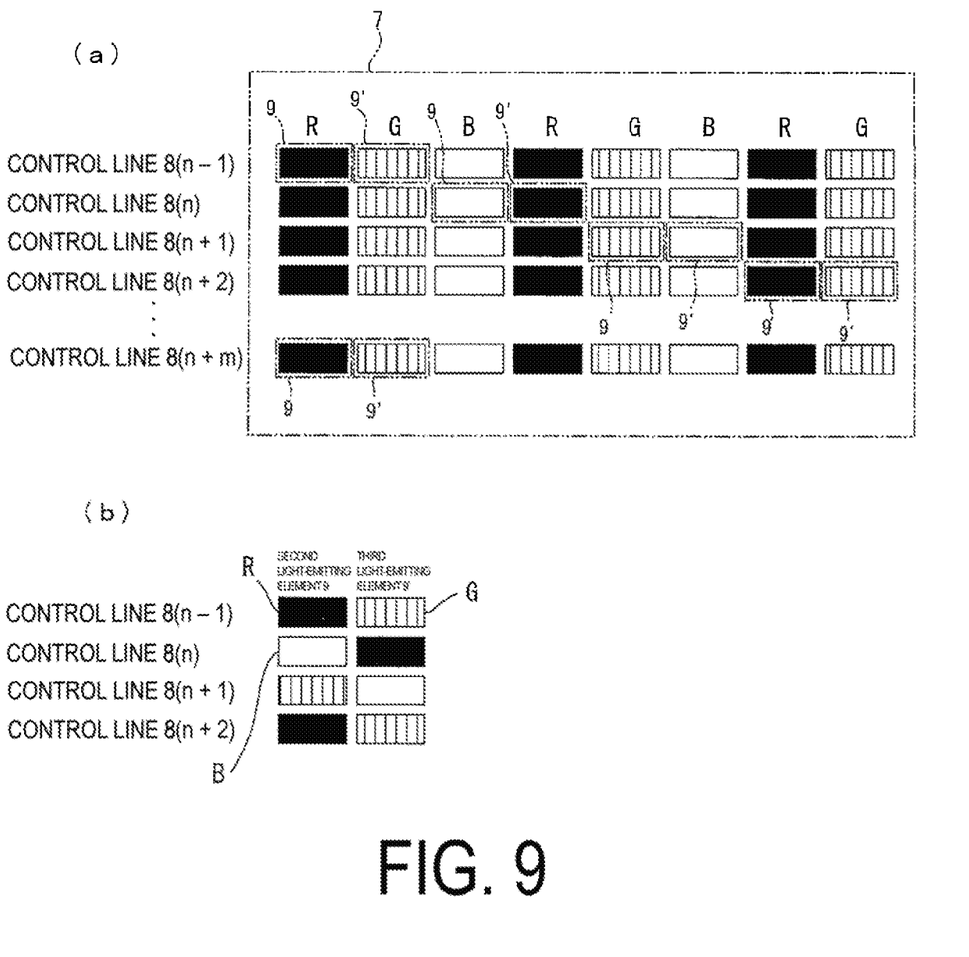
FIG. 9 is a combination example of colors in a case where the luminescent colors of the second light-emitting element 9 and the third light-emitting element 9' are different for each control line 8. (a) is a schematic diagram in which an arrangement of light-emitting elements formed on the light-emitting device 2 and control lines 8 orthogonal to the arrangement are corresponding. (b) is a table of combinations of the second light-emitting element 9 and the third light-emitting element 9' provided on each control line 8.

As illustrated in FIG. 9(a), the luminescent colors of the second light-emitting element 9 and the third light-emitting element 9' may be different for each control line 8. As an example, in a case where the luminescent color of the first light-emitting element 6 in the display region 3 is a first luminescent color, the luminescent colors of the second light-emitting element 9 and the third light-emitting element 9' provided in the control line 8(n−1) can be set to a second luminescent color and a third luminescent color. In a case where the luminescent colors of the second light-emitting element 9 and the third light-emitting element 9' provided in the control line 8(n) are a fourth luminescent color and a fifth luminescent color, either of the fourth luminescent color or the fifth luminescent color is preferably a luminescent color different from the second luminescent color or the third luminescent color.

This is because it is possible to distinguish the color mixtures in a case of functioning normally for each control line 8, making it easy to identify the control line by color.

In other words, in the second embodiment, a combination example of colors in a case where the luminescent colors of the second light-emitting element 9 and the third light-emitting element 9' are different for each control line 8 is illustrated in FIG. 9. FIG. 9(a) illustrates an arrangement of light-emitting elements formed in the vertical direction in the frame region 7 of the light-emitting device 2. The rows of light-emitting elements are repeatedly formed in rows having luminescent colors of a red color (R), a green color (G), and a blue color (B) in the left and right direction.

Note that the black filled rectangular symbol R represents a light-emitting element that emits red light, and the longitudinal hatched rectangular symbol G represents a light-emitting element that emits green light. The white rectangular symbol B represents a light-emitting element that emits blue light.

The control lines 8(n−1) to 8(n+2), . . . , 8(n+m) are disposed orthogonal to the rows of light-emitting elements. Here, n and m represent integers. Each of the control lines 8 can configure the determination circuit 10 so that the luminescent colors of the second light-emitting element 9 and the third light-emitting element 9' are a combination indicated by the two-dot chain line. For example, the second luminescent color of the control line 8(n−1) may be red R, the third luminescent color may be green G, the fourth luminescent color of the control line 8(n) may be green G, and the fifth luminescent color may be blue B. According to this configuration, as illustrated in the table in FIG. 9(b), one of the second light-emitting element 9 and the third light-emitting element 9' included in adjacent control lines 8 can be combined differently, and in a case where inspection of the plurality of control lines 8 is performed, whether or not the corresponding control lines 8 are faulty can be easily inspected by observing the color at each control line 8.

Note that the meaning is that the second light-emitting element 9 and the third light-emitting element 9' are provided for each control line 8, but the second light-emitting element and the third light-emitting element 9' may not be provided for each control line 8 of all of the control lines 8, and may be provided for each of some of the control lines 8 among the plurality of control lines 8. For example, the second light-emitting element 9 and the third light-emitting element 9' may be provided for every two or every three control lines 8.

Structure of Second Light-Emitting Element 9 and Third Light-Emitting Element 9'

The second light-emitting element 9 and the third light-emitting element 9' can be disposed in the frame region 7 so as to be clearly distinguished from the first light-emitting element formed in the display region 3. In forming the display region 3 constituted by the pixels 5 including the first light-emitting elements, light-emitting elements included in dummy pixels formed slightly outside the outer edge of the display region 3 may be used as the second light-emitting element and the third light-emitting element.

Figure 10:
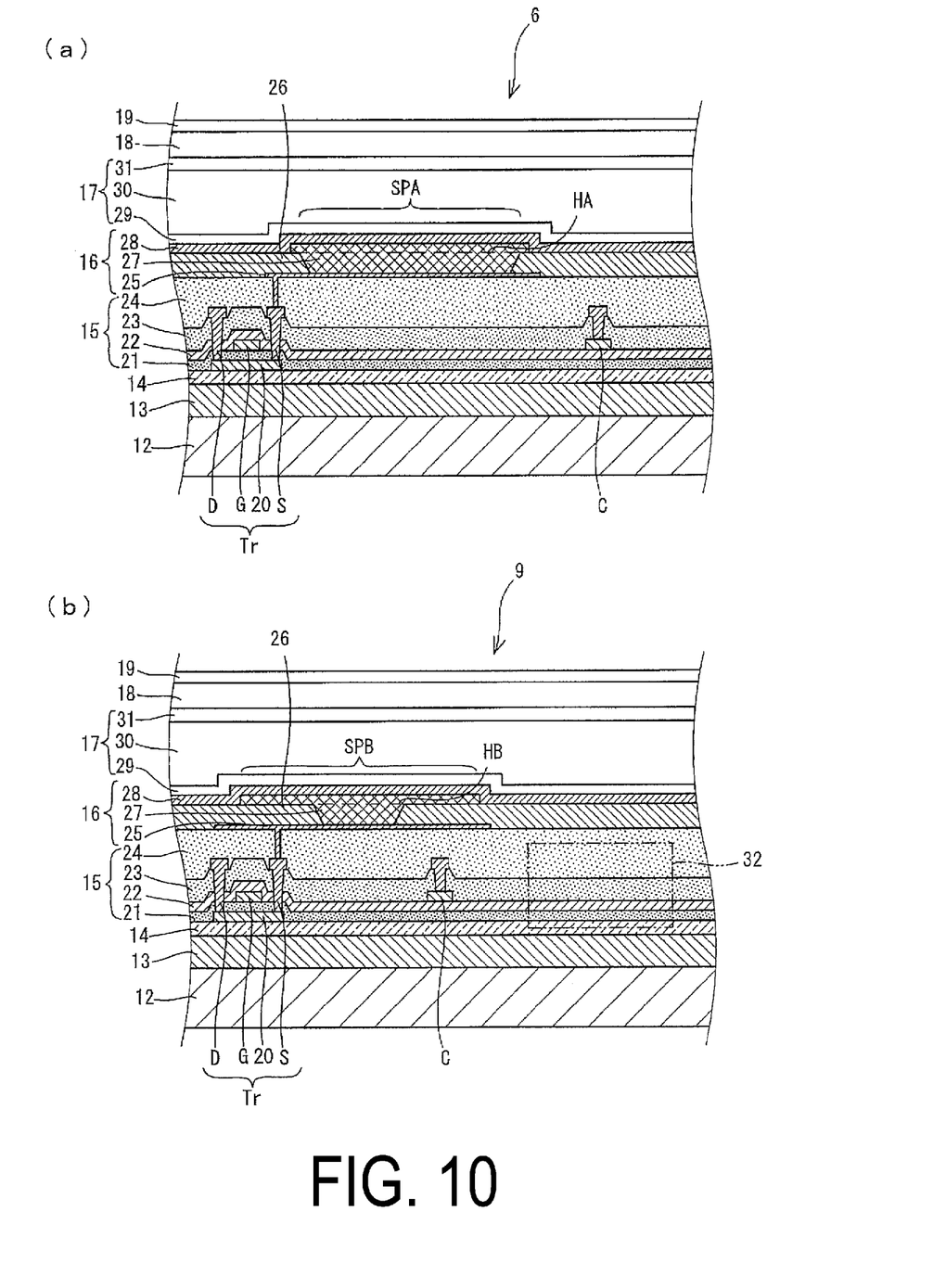

(a) of FIG. 10 illustrates a cross-sectional example of a periphery of a subpixel SPA indicating one luminescent color of the first light-emitting element 6, and (b) of FIG. 10 illustrates a cross-sectional example of a periphery of a subpixel SPB indicating one luminescent color as the second light-emitting element 9. Note that, in the following description, the subpixel SPB using the second light-emitting element 9 is illustrated, and the subpixel using the third light-emitting element 9' is the same as the subpixel SPB, and thus descriptions thereof will be omitted. The light-emitting element illustrated in FIG. 10(a) or 10(b) is a top-emitting type that emits light upward, and includes, in sequence from the bottom side, a base material 12, a resin layer 13, a barrier layer 14 (base coat layer), a TFT layer 15, a light-emitting element layer 16, a sealing layer 17, an adhesive layer 18, and a function film 19.

The TFT layer 15 includes a semiconductor film 20, an inorganic insulating film 21 formed in a layer above the semiconductor film 20, a gate electrode G formed in a layer above the inorganic insulating film 21, an inorganic insulating film 22 formed in a layer above the gate electrode G, a capacitance electrode C formed in a layer above the inorganic insulating film 22, an inorganic insulating film 23 formed in a layer above the capacitance electrode C, a source electrode S and a drain electrode D both formed in a layer above the inorganic insulating film 23, and a flattening film 24 formed in a layer above the source electrode S and the drain electrode D.

A thin film transistor Tr (light emission control transistor) includes the semiconductor film 20, the inorganic insulating film 21 (gate insulating film), and the gate electrode G. The source electrode S is connected to a source region of the semiconductor film 20, and the drain electrode D is connected to a drain region of the semiconductor film 20.

The semiconductor film 20 is formed of low-temperature polysilicon (LTPS) or an oxide semiconductor, for example. In FIG. 10, the TFT is illustrated as having a top gate structure in which the semiconductor film 20 is the channel.

The light-emitting element layer 16 is an organic light-emitting diode layer in the present embodiment, and includes an anode electrode 25 formed in a layer above the flattening film 24, an edge cover 26 which is a flattening film that defines the subpixels SPA or SPB in an active region (a region overlapping the light-emitting element layer 16), a light-emitting layer 27 formed in a layer above the anode electrode 25, and a cathode electrode 28 formed in a layer above the light-emitting layer 27. An organic light-emitting diode (OLED) includes the anode electrode 25, the light-emitting layer 27, and the cathode electrode 28.

The edge cover 26 surrounds the end portions of the anode electrode 25. The light-emitting layer 27 is formed in a region surrounded by the edge cover 26, by using a vapor deposition method or an ink-jet method.

The anode electrode 25 is a light reflectivity and is configured by the layering of Indium Tin Oxide (ITO) and an alloy containing Ag, for example. The cathode electrode 28 can be configured from a transparent conductive material such as ITO and Indium Zinc Oxide (IZO).

Because the cathode electrode 28 is transparent and the anode electrode 25 is a light reflectivity, the light emitted from the light-emitting layer 27 travels upwards and results in top emission.

The sealing layer 17 is transparent, and includes an inorganic seating film 29, which covers the cathode electrode 28, the organic sealing film 30 formed in a layer above the inorganic sealing film 29, and an organic seating film 31, which covers the organic sealing film 30. The sealing layer 17 covers the light-emitting element layer 16 and inhibits foreign matters, such as water and oxygen, from infiltrating to the light-emitting element layer 16. The function film 19 has an optical compensation function, a touch sensor function, a protection function, or the like, for example.

Example of Structures of Subpixels SPA and SPB

Figure 11:
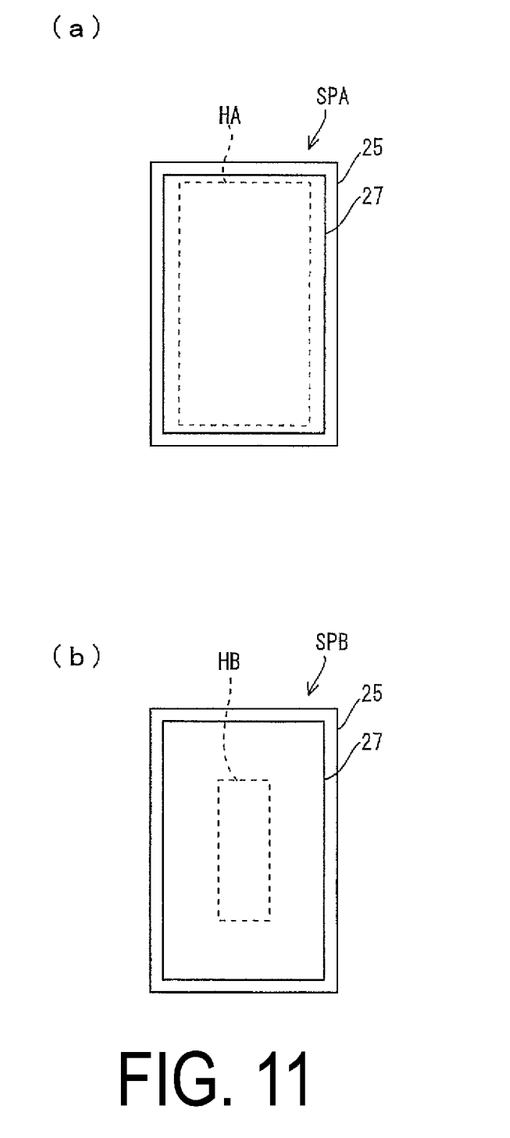
FIG. 11 illustrates a plan view (a) of the first light-emitting 6 and a plan view (b) of the second light-emitting element 9.

FIG. 11 is a plan view illustrating an example of the structures of the subpixels SPA and SPB a. As illustrated in (a) of FIG. 10 and (a) of FIG. 11, each subpixel SPA includes at least the edge cover 26, which has an opening HA, and the light-emitting layer 27, which is arranged in a layer above the edge cover 26. In the subpixel SPA, the edge cover 26 surrounds the entire periphery of the opening HA. The light-emitting layer 27 is formed completely occupying at least the opening HA. The surface area of the light-emitting layer 27 is greater than the surface area of the opening HA. Of the light-emitting layer 27, the range that overlaps with the opening HA contributes to the light emission of the first light-emitting element 6.

As illustrated in (b) of FIG. 10 and (b) of FIG. 11, each subpixel SPB includes at least the edge cover 26, which has an opening HB, and the light-emitting layer 27, which is arranged in a layer above the edge cover 26 and has equal shape and equal size as the light-emitting layer 27 in the subpixel SPA. In the subpixel SPB, the edge cover 26 surrounds the entire periphery of the opening HB. The light-emitting layer 27 is formed completely occupying at least the opening HB. The surface area of the light-emitting layer 27 is greater than the surface area of the opening 14B. The range of the light-emitting layer 27 overlapping the opening HB contributes to the light emission of the second light-emitting element 9 (or the light emission of the third light-emitting element 9'). In this way, the opening HA of the edge cover 26 of the light-emitting layer 27 of the first light-emitting element 6 is larger than the opening HB of the edge cover 26 of the light-emitting layer 27 of the second light-emitting element 9. Thus, even in a case where the vapor deposition shift occurs in the light-emitting layer 27 of the second light-emitting element 9 that is deposited at the end of the vapor deposition mask, by making the opening HB of the edge cover 26 of the light-emitting layer 27 of the second light-emitting element 9 be smaller in this way, the light-emitting layer 27 can be formed so as to cover the opening HB of the edge cover 26, and it is possible to reliably emit light in the desired light-emitting region (the same applies to the third light-emitting element 9').

Note that, in addition to the above description, for example, even in a case where the second and third light-emitting elements 9 and 9' are formed in a portion on the central portion side rather than at the end of the vapor deposition mask, or the second and third light-emitting elements 9 and 9' are formed by using a vapor deposition mask different from that of the first light-emitting element 6, the light-emitting area of the first light-emitting element 6 and the light-emitting area of the second and third light-emitting elements 9 and 9' may be the same size.

The "equal shape and equal size" mentioned above means that even in a case where the luminescent material of the light-emitting layer 27 is deposited in the display region 3 and the outer edge region of the display region 3 by using masks having mask patterns of equal shape and equal size, the light-emitting layers 27 of equal shape and equal size will be formed as a result in the display region 3 and the outer edge region of the display region 3 (hereinafter, referred to as a dummy region). Therefore, in using the vapor deposition technique, even in a case of using masks having mask patterns of the equal size, the light-emitting layer 27 of the subpixel SPA and the light-emitting layer 27 of the subpixel SPB may not necessarily be completely formed in the equal shape and equal size.

Note that the dummy region 7a is formed by using a mask in forming the display region 3, but is formed slightly outside the region where the image content is displayed as indicated by the dot-dash line in FIG. 1, and therefore belongs to the frame region 7 in the disclosure. The pixels formed in the dummy region 7a are referred to as dummy pixels. The light-emitting elements constituting the dummy pixels may be formed simultaneously with the first light-emitting element 6, and may be the second light-emitting element 9 and the third light-emitting element 9'.

As illustrated in FIG. 11, the openings HA, which are provided on the inner sides of the anode electrodes 25 formed in the display region 3, are larger than the openings HB, which are provided on the inner sides of the anode electrodes 25 formed in the dummy region 7a. Furthermore, the light-emitting layer 27 formed in the display region 3 has equal shape and equal size to the light-emitting layer 27 formed in the dummy region 7a.

The openings HB are smaller than the openings HA, and thus even in a case where there is a lower precision in the deposition pattern used in depositing the luminescent material in the dummy region 7a, the light-emitting layer 27 is formed so as to completely cover the openings HB in the dummy region 7a. Therefore, the subpixels SPB that function correctly can be formed in the dummy region 7a.

To ensure sufficient light emission from the light-emitting layer 27, contact holes cannot be provided in the display region 3 so as to overlap parts of the light-emitting layer 27 filled with the openings HA. Thus as illustrated in (a) of FIG. 10, in the display region 3, contact holes of the thin film transistor Tr are formed in positions that do not overlap the openings HA. Likewise, a contact hole of the capacitance electrode C is formed in a position that does not overlap the openings HA.

In the dummy region 7a, the parts of the light-emitting layer 27 that do not overlap the openings HB do not function as an active light-emitting layer 27. Thus as illustrated in (b) of FIG. 10, in the dummy region 7a, the contact holes of the thin film transistor Tr can be formed in parts of the light-emitting layer 27 that do not overlap the opening HB (parts that overlap the opening HA in the display region 3). Likewise, a contact hole of the capacitance electrode C can be formed in a part of the light-emitting layer 27 that does not overlap the opening HB. Thus in the dummy region 7a, the thin film transistor Tr and the capacitance electrode C can both be provided closer to the opening HB. In this way, the light-emitting elements constituting the dummy pixels are used for the second light-emitting element 9 and the third light-emitting element 9', and the determination circuit 10 is installed in the dummy region 7a, so a special space is not required to form the second light-emitting element 9, the third light-emitting element 9', and the determination circuit 10, and it is possible to facilitate frame narrowing of the display device 2. Note that a region 32 may be used as another circuit arrangement space.

Manufacturing Method of Display Device 2

By inputting an electrical signal flowing through the control line 8 or an electrical signal flowing through a node n or the like provided in the control circuit 1 to the second light-emitting element 9 and the third light-emitting element 9', and detecting and evaluating the light emission from the second light-emitting element 9 and the light emission from the third light-emitting element 9', a manufacturing method of the display device 2 having the inspection process for inspecting the control circuit 1 can be realized.

According to this manufacturing method, the defect of the scanning line drive circuit or the emission driver can be detected, for example, after the vapor deposition step of the material that constitutes the light-emitting element and before the ink-jet thin film encapsulation (TFE) step, so it is possible to sort the driver defect at an earlier stage than that of a known panel inspection.

In particular, as exemplified in the above detection examples 1 and 2, a method for manufacturing a display device that detects a defect of a corresponding control line or a corresponding node by using a color mixture of the luminescent color of the second light-emitting element 9 and the luminescent color of the third light-emitting element 9' is preferable. As a result, the display device 2 can be manufactured with clarity at an earlier stage than in the known art. Note that in the description above, a case has been described in which the second light-emitting element 9 and the third light-emitting element 9' are provided for each control line 8, but the second light-emitting element 9 and the third light-emitting element 9' may not be provided for each control line 8 of all of the control lines 8 (for example, the scanning line and the emission line), and may be provided for each of some of the control lines 8 among the plurality of control lines 8. For example, the second light-emitting element 9 and the third light-emitting element 9' may be provided for every two or every three control lines 8.

In the above description, as illustrated in FIG. 4, the case has been described in which in the determination circuit 10, the first and second transistors T1 and T2 are each composed of a NMOS transistor and a PMOS transistor, only the second light-emitting element 9 connected to the first transistor (NMOS transistor) T1 is caused to emit light in a case where the electrical signal is high voltage, and only the third light-emitting element 9' connected to the second transistor (PMOS transistor) T2 is caused to emit light in a case where the electrical signal is low voltage. However, the disclosure is not limited thereto, and only one of the second light-emitting element 9 and the third light-emitting element 9' may be caused to emit light in a case where the electrical signal is on including the high level or in a case where the electrical signal is off including the low level.

The display according to the present embodiment is not particularly limited as long as it is a display panel including a display element. The display element is a display element of which luminance and transmittance are controlled by an electric current, and examples of the electric current-controlled display element include an organic Electro Luminescence (EL) display provided with an Organic Light Emitting Diode (OLED), an EL display such as an inorganic EL display provided with an inorganic light emitting diode, and a QLED display provided with a Quantum dot Light Emitting Diode (QLED).

The invention claimed is:

1. A display device including a display region and a frame region provided around the display region, and configured to display an image by causing a first light-emitting element provided in the display region to emit light, the display device comprising:
   a plurality of data lines to which data signals are supplied to display the image;
   a plurality of control lines arranged to intersect the plurality of data lines;
   a plurality of pixel circuits provided with the first light-emitting element provided at each intersection point of the plurality of data lines and the plurality of control lines;
   a control circuit configured to activate a corresponding control line at a timing at which a data signal of the data signals is supplied to a data line of the plurality of data lines;
   a second light-emitting element and a third light-emitting element provided in the frame region for each of the plurality of control lines, the second light-emitting element and the third light-emitting element being configured to emit different colors from each other; and
   a determination circuit provided in the frame region for each of the plurality of control lines, the determination circuit being connected to a control line of the plurality of control lines or a node provided in the control circuit,
   wherein the second light-emitting element and the third light-emitting element are connected to the control line or the node via the determination circuit, and
   the determination circuit causes the second light-emitting element to emit light but does not cause the third light-emitting element to emit light in a case where an electrical signal from the control line or the node is one of on and off, and does not cause the second light-emitting element to emit light but causes the third light-emitting element to emit light in a case where an electrical signal from the control line or the node is other of on and off.

2. The display device according to claim 1,
   wherein the determination circuit comprises:
   a first transistor including a first control terminal to which the control line or the node is connected; and
   a second transistor including a second control terminal connected to the control line or the node connected to the first control terminal,
   in the first transistor, a first conduction terminal is connected to one of an anode electrode or a cathode electrode of the second light-emitting element, and a second conduction terminal is connected to one of an anode electrode or a cathode electrode of the third light-emitting element and a first constant voltage source, and
   in the second transistor, a first conduction terminal is connected to other of the anode electrode or the cathode electrode of the second light-emitting element and a second constant voltage source, and a second conduction terminal is connected to other of the anode electrode or the cathode electrode of the third light-emitting element.

3. The display device according to claim 2,
   wherein the determination circuit further comprises:
   a third transistor connected between the second conduction terminal of the first transistor and the one of the anode electrode or the cathode electrode of the third light-emitting element and the first constant voltage source, and
   a control signal line for controlling on/off of the third transistor is connected to a control terminal of the third transistor.

4. The display device according to claim 1,
   wherein in two of the determination circuit adjacent, a luminescent color of a light-emitting element of at least one of the second light-emitting element and the third light-emitting element connected to one of the two of the determination circuit and a luminescent color of a light-emitting element of at least other of the second light-emitting element and the third light-emitting element connected to other of the two of the determination circuit differ from each other.

5. The display device according to claim 1,
   wherein the second light-emitting element and the third light-emitting element are provided between the display region and the control circuit, a light-emitting layer of the first light-emitting element and each light-emitting layer of the second light-emitting element and the third light-emitting element are in equal shape and equal size, and an opening of an edge cover of the light-emitting layer of the first light-emitting element is larger than an opening of an edge cover of each light-emitting layer of the second light-emitting element and the third light-emitting element.

6. The display device according to claim 1,
   wherein a plurality of kinds of light-emitting elements emitting different colors from each other are used for a plurality of the second light-emitting element each provided in the plurality of control lines, and
   a plurality of kinds of light-emitting elements emitting different colors from each other are used for a plurality of the third light-emitting element each provided in the plurality of control lines.

7. The display device according to claim 1,
   wherein a plurality of the nodes are provided, a plurality of kinds of light-emitting elements emitting different colors from each other are used for a plurality of the second light-emitting element each provided in the plurality of the nodes, and a plurality of kinds of light-emitting elements emitting different colors from each other are used for a plurality of the third light-emitting element each provided in the plurality of the nodes.

8. The display device according to claim 1,
wherein the control line is a scanning line and an emission line, the control circuit is a scanning line drive circuit and an emission driver, a plurality of kinds of light-emitting elements emitting different colors from each other are used for a plurality of the second light-emitting element each provided in the scanning line and the emission line, and a plurality of kinds of light-emitting elements emitting different colors from each other are used for a plurality of the third light-emitting element each provided in the scanning line and the emission line.

9. The display device according to claim 1,
wherein the control line is a scanning line, and the control circuit is a scanning line drive circuit.

10. The display device according to claim 1,
wherein the control line is an emission line, and the control circuit is an emission driver.

11. The display device according to claim 1,
wherein the first light-emitting element, the second light-emitting element, and the third light-emitting element are organic EL elements.

12. A method for manufacturing a display device comprising: a display region; a frame region provided around the display region; a first light-emitting element provided in the display region for displaying an image; a plurality of data lines to which data signals are supplied to display the image; a plurality of control lines arranged to intersect the plurality of data lines; a plurality of pixel circuits provided with the first light-emitting element provided at each intersection point of the plurality of data lines and the plurality of control lines; a control circuit configured to activate a corresponding control line at a timing at which a data signal of the data signals is supplied to a data line of the plurality of data lines; a second light-emitting element and a third light-emitting element provided in the frame region for each of the plurality of control lines, the second light-emitting element and the third light-emitting element being configured to emit different colors from each other; and a determination circuit provided in the frame region for each of the plurality of control lines, the determination circuit being connected to a control line of the plurality of control lines or a node provided in the control circuit,
wherein the control circuit is inspected by inputting, to the second light-emitting element and the third light-emitting element, an electrical signal flowing through the control line or an electrical signal flowing through a node provided in the control circuit via the determination circuit, and detecting and evaluating light emission from the second light-emitting element and the third light-emitting element.

13. The method for manufacturing the display device according to claim 12,
wherein in inspecting the control circuit, a color mixture of a luminescent color of the second light-emitting element and a luminescent color of the third light-emitting element is used to detect a defect of a corresponding control line or a corresponding node.

14. The method for manufacturing the display device according to claim 12,
wherein the first light-emitting element, the second light-emitting element, and the third light-emitting element are formed simultaneously.

* * * * *